United States Patent
Lattimore et al.

[11] Patent Number: 6,144,609
[45] Date of Patent: Nov. 7, 2000

[54] MULTIPORT MEMORY CELL HAVING A REDUCED NUMBER OF WRITE WORDLINES

[75] Inventors: George McNeil Lattimore, Austin, Tex.; Dieter Wendel, Schoenaich; Friedrich-Christian Wernicke, Holzgerlingen, both of Germany

[73] Assignee: International Business Machines Corporation, Armonk, N.Y.

[21] Appl. No.: 09/361,363

[22] Filed: Jul. 26, 1999

[51] Int. Cl.[7] .................................................. G11C 8/00
[52] U.S. Cl. ................................. 365/230.05; 365/230.06
[58] Field of Search ......................... 365/230.05, 230.06, 365/189.01, 69

[56] References Cited

U.S. PATENT DOCUMENTS

| | | | |
|---|---|---|---|
| 4,377,857 | 3/1983 | Tickle | 365/185 |
| 5,469,380 | 11/1995 | Iio | 365/154 |
| 5,710,742 | 1/1998 | Carter et al. | 365/230.05 |
| 5,734,613 | 3/1998 | Gibson | 365/189.04 |
| 5,742,557 | 4/1998 | Gibbins et al. | 365/230.05 |
| 5,886,919 | 3/1999 | Morikawa et al. | 365/69 |
| 5,959,931 | 9/1999 | Ueda | 365/230.05 |
| 5,995,425 | 11/1999 | Henkels et al. | 365/201 |

*Primary Examiner*—Richard Elms
*Assistant Examiner*—Anh Phung
*Attorney, Agent, or Firm*—Anthony V. S. England; Felsman, Bradley, Vaden, Gunter & Dillon, LLP

[57] ABSTRACT

A multiport memory cell having a reduced number of write wordlines is disclosed. The multiport memory cell capable of simultaneously reading data from and writing data to a storage cell comprises a storage cell for storing data, a decoder, write wordlines, write bitlines, read wordlines, and read bitlines. The write wordlines and the write bitlines are utilized to input write data into the storage cell. The read wordlines and the read bitlines are utilized to output data from the storage cell. The write bitlines are directly coupled to the storage cell, and some or all of the write wordlines are coupled to the storage cell via the decoder for the purpose of wire reduction. Similar to the write bitlines, all the read bitlines and read wordlines are directly coupled to the storage cell.

7 Claims, 3 Drawing Sheets

MULTIPORT MEMORY CELL HAVING A REDUCED NUMBER OF WRITE WORDLINES

BACKGROUND OF THE INVENTION

1. Technical Field

The present invention relates to integrated circuits in general, and in particular to multiport memory cell circuits. Still more particularly, the present invention relates to a multiport memory cell having a reduced number of write wordlines.

2. Description of the Prior Art

Multiport memories are random access memories that have multiple ports to enable parallel accesses, such as simultaneously reading a first memory location via a first port and writing a second memory location via a second port. Typically, multiport memories find their application within integrated circuit devices as register files. A register file is a temporary buffer for storing intermediate results (and arguments) that are produced and used by various functional parts of an integrated circuit device, as is well-known to those skilled in the relevant art.

For an integrated circuit device that includes a register file having a large number of ports, the area occupied by the multiport memory cells within the register file is usually wire-limited. In other words, the large number of wires that are used to access the multiport memory cells within the register file causes the total area to be dependent on the number of wires rather than the number and/or size of transistors used. example, if a multiport memory cell has four read ports, 12 write ports, and one write_select port, the multiport memory cell must have 16 wordlines (12 write wordlines and four read wordlines), 16 bitlines (12 write bitlines and four read bitlines), and a write_select line. This means there are 17 wires in the wordline direction (12 write wordlines, four read wordlines, and one write_select line) and 16 wires in the bitline direction (12 write bitlines and four read bitlines). The present disclosure provides a solution that reduces the number of wires in the wordline direction of the above-mentioned multiport memory cell to less than 17 wires.

SUMMARY OF THE INVENTION

In accordance with a preferred embodiment of the present invention, a multiport memory cell capable of simultaneously reading data from and writing data to a storage cell comprises a storage cell for storing data, a decoder, write wordlines, write bitlines, read wordlines, and read bitlines. The write wordlines and the write bitlines are utilized to input write data into the storage cell. The read wordlines and the read bitlines are utilized to output data from the storage cell. The write bitlines are directly coupled to the storage cell, and some or all of the write wordlines are coupled to the storage cell via the decoder for the purpose of wire reduction. Similar to the write bitlines, all the read bitlines and read wordlines are directly coupled to the storage cell.

All objects, features, and advantages of the present invention will become apparent in the following detailed written description.

DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
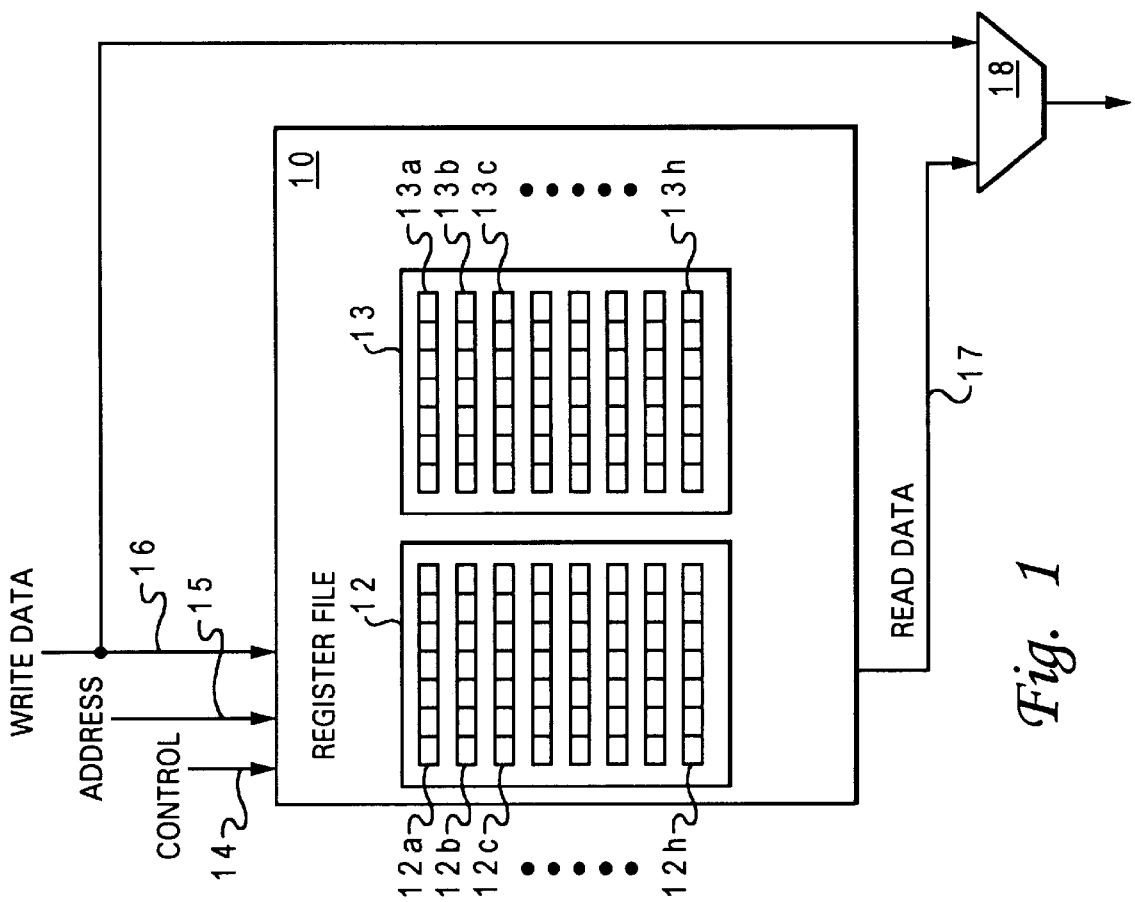
FIG. 1 is a block diagram of a register file in accordance with a preferred embodiment of the present invention.

Referring now to the drawings and in particular to FIG. 1, there is illustrated a block diagram of a register file in accordance with a preferred embodiment of the present invention. As shown, a register file 10 includes a number of registers 12a–12h and 13a–13h, which may be organized into banks 12 and 13, respectively. Each of registers 12a–12h and 13a–13h contains several multiport memory cells, each multiport memory cell storing one bit of data. A control circuit (not shown) may be used to write data into register file 10 by providing the data to be written on a data bus 16, a register address (or other identifier of a register) on an address bus 15, and control signals on a control bus 14. The same control circuit may also be used to read data from register file 10 by providing a register address on address bus 15 along with control signals on control bus 14, and the data is read from data bus 17. The write data and the read data can be multiplexed via a multiplexor 18, to be further utilized by other circuitry within an integrated circuit.

Figure 2:
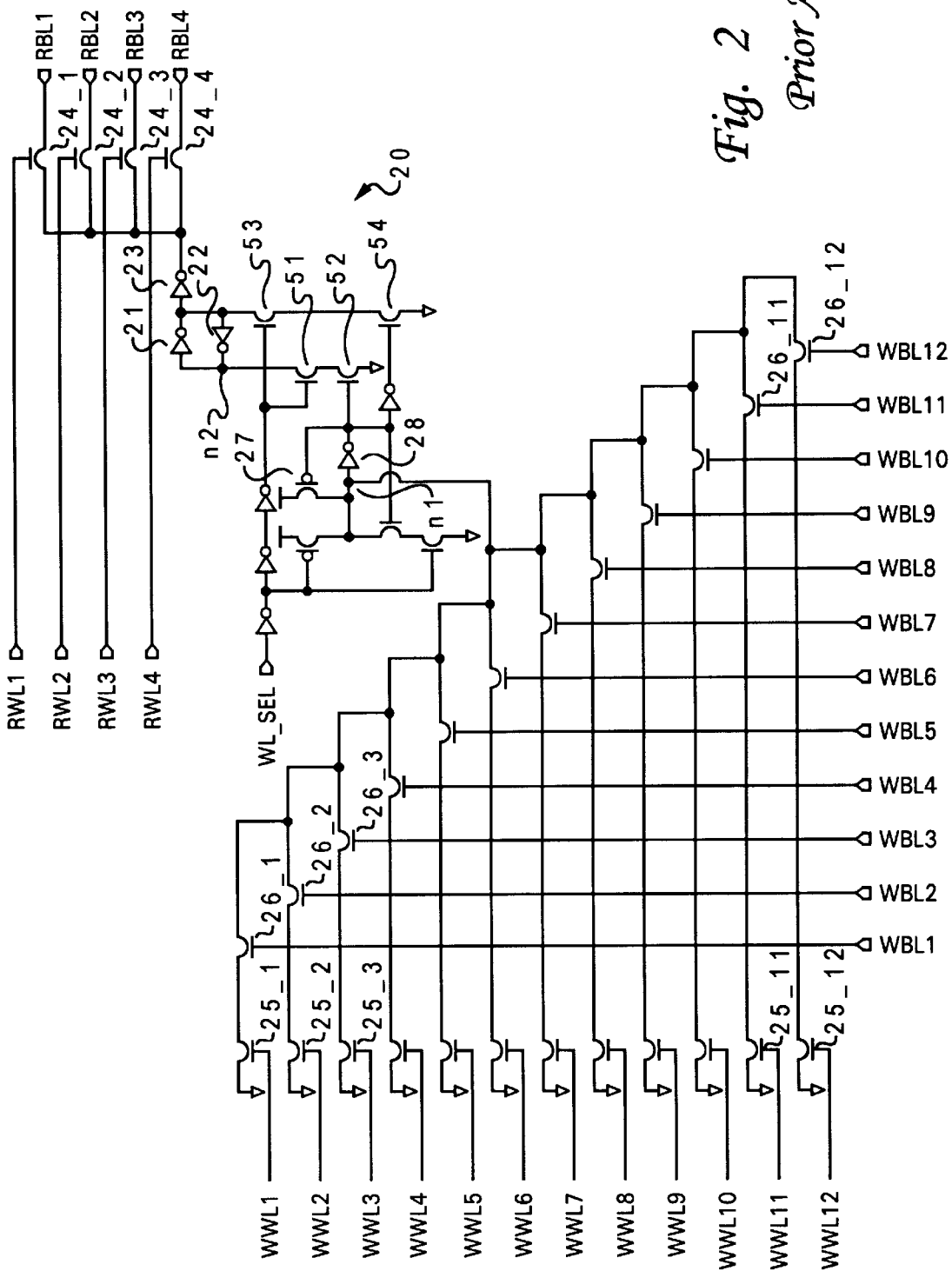
FIG. 2 is a schematic diagram of a multiport memory cell within a register file, in accordance with the prior art.

With reference now to FIG. 2, there is depicted a schematic diagram of a multiport memory cell within a register file, in accordance with the prior art. Multiport memory cell 20 includes a storage cell formed by inverters 21 and 22. Inverters 21, 22 are typically constructed by two pairs of cross-coupled transistors as understood by those skilled in the art. As shown, multiport memory cell 20 includes four read ports that are comprised of an inverter 23 and n-channel transistors 24_1, 24_2, 24_3, and 24_4. Each of transistors 24_1–24_4 is individually controlled by a read wordline and a read bitline. For example, transistor 24_1 is controlled by read wordline RWL1 and read bitline RBL1, while transistor 24_2 is controlled by read wordline RWL2 and read RBL2. Data stored in the storage cell can be read via any one of the four read ports.

In addition, multiport memory cell 20 also includes twelve write ports, comprised of twelve n-channel transistors 25_1–25_12 and twelve n-channel transistors 26_1–26_12. During a write operation, a write select (WL_SEL) line is asserted, data will be written from one of the twelve write ports to node n1. Subsequently, while the WL_SEL line is asserted, the data in node n1 will be written to node n2 via one of the n-channel pull-down transistor pairs, such as transistor pair 51, 52 or transistor pair 53, 54.

It is apparent from FIG. 2 that the number of wires can be overwhelming when there is a large number of write ports in a multiport memory cell, such as multiport memory cell 20. The number of wires in the write ports can be reduced by encoding the write wordlines on the write ports and then decoding the write wordlines within the multiport memory cell itself.

In accordance with a preferred embodiment of the present invention, the decoding of the write wordlines is achieved by adding a decoder within the multiport memory cell. The addition of the decoder certainly requires more transistors, but it also reduces the number of wires required. Hence, this design allows the wiring requirements to be balanced with the transistor requirement. As a result, wireability is improved.

Figure 3:
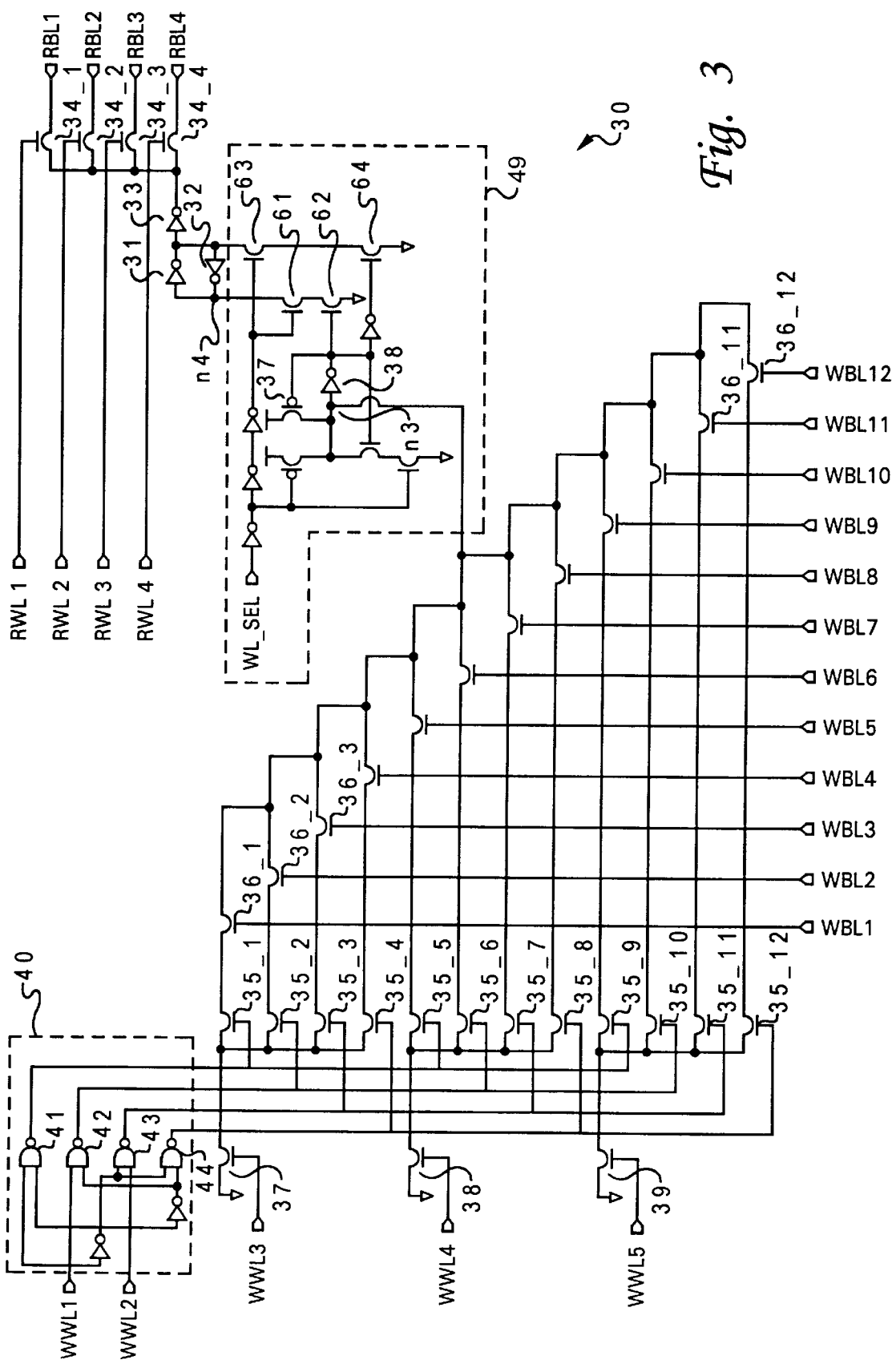
FIG. 3 is a schematic diagram of a multiport memory cell within a register file, in accordance with a preferred embodiment of the present invention.

Referring now to FIG. 3, there is illustrated a schematic diagram of a multiport memory cell within a register file, in accordance with a preferred embodiment of the present invention. Similar to FIG. 2, a multiport memory cell 30 includes a storage cell formed by inverters 31 and 32 typically constructed by two pairs of cross-coupled transistors as understood by those skilled in the art.

Multiport memory cell 30 has four read ports that are comprised of an inverter 33 and four n-channel transistors 34_1, 34_2, 34_3, and 34_4. Each of transistors 34_1-34_4 is individually connected by a read wordline and a read bitline. Data stored in the storage cell within multiport memory cell 30 can be read via any one of the four read ports.

In addition, multiport memory cell 30 includes twelve write ports, comprised of twelve n-channel transistors 35_1-35_12 and twelve n-channel transistors 36_1-36_12. During a write operation, a write select (WL_SEL) line is asserted, data will be written from one of the twelve write ports to node n3. Subsequently, while the WL_SEL line stay at a high level (i.e., asserted), the data in node n3 will be written to node n4 (the storage node) via one of the n-channel pull-down transistor pairs, such as transistor pair 61, 62 or transistor pair 63, 64.

Multiport memory cell 30 has twelve write bitline inputs, WBL1–WBL12, and only five write wordline inputs, WWL1–WWL5 (which is seven write wordline inputs less than multiport memory cell 20 of FIG. 2). Each of transistors 36_1-36_12 directly corresponds to one of the twelve write bitline inputs. Transistors 35_1-35_12, in this example, are arranged in a matrix-decode fashion. Each one out of three groups (transistors 35_1-35_4, 35_5-35_8, and 35_9-35_12) are connected separately to one of the write wordlines WWL3, WWWL4, and WWL5 via n-channel transistors 37, 38, and 39, respectively. Each transistors 35_1-35_12 has its gate connected to one of four outputs of binary decoder 40. Transistor 35_1, 35_5, and 35_9 are coupled to the first output of the decoder. Transistors 35_2, 35_6, and 35_10 are connected to the second output and so on.

In FIG. 3, decoder 40 is implemented as a static binary decoder. As shown, decoder 40 includes four two-input NAND gates 41–44. With decoder 40, four write wordlines can be decoded by two write wordlines WWL1 and WWL2. Furthermore, transistors 35_1-35_12 are conveniently organized into three groups-35_1-35_4 (group one), 35_5-35_9 (group two), and 35_9-35_12 (group three). Because the four write wordlines output from decoder 40 are connected to all three groups in parallel, one write wordline in each of the three groups will be asserted by decoder 40 during a write operation. At this point, data can be placed on one of the three remaining write wordlines (i.e., WWL3, WWL4, and WWL5) such that the data can be correctly positioned at one of the twelve write ports.

When compared with the similar prior art configuration shown in FIG. 2, the present implementation has only five write wordlines instead of twelve write wordlines. Thus, the total number of wires in the wordline direction is reduced from 17 to 10 (five write wordlines, four read wordlines, and one write_select line). The total number of wires in the bitline direction remains the same at 16 in this example.

As has been described, the present invention provides a method for reducing the number of wordlines within a multiport memory cell. The present invention improves the wireability and reduces the port size of a multiport memory cell array that has a significant number of write ports. The present invention also allows a circuit designer to reduce the chip area of a multiport memory cell until the chip area is no longer wire-limited.

The solution of the present invention is dependent on the fact that only one write operation can occur at a time within a multiport memory cell. Although there can be multiple read operations occurring during the same cycle because a read operation does not change the data stored in the multiport memory cell, there can only be one write per cycle in order to guarantee the state of the multiport memory cell.

It is understood by those skilled in the art that the current implementation as depicted within dotted line 40 of FIG. 3 is merely illustrative. For example, a static binary decoder is utilized in the present disclosure, but it is understood that a dynamic decoder can also be used. The choice of decoder is typically dictated by the chip area and the speed requirement of the entire circuit. In addition, it is understood by those skilled in the art that the current implementation as depicted within dotted line 49 of FIG. 3 is also illustrative.

It is noted that the present invention is particularly useful where the number of write ports within a multiport memory cell is greater than four. For example, it takes three wires to implement the present invention on a multiport memory cell having four write ports, which is not a significant savings. But it only takes four wires to implement the present invention on a multiport memory cell having five to eight write ports. Thus, the wiring reduction is 50% in the case of eight write ports. Similarly, in the case of 16 write ports, only five wires are required, which is almost a 70% wire reduction.

While the invention has been particularly shown and described with reference to a preferred embodiment, it will be understood by those skilled in the art that various changes in form and detail may be made therein without departing from the spirit and scope of the invention.

What is claimed is:

1. A multiport memory comprising:
    a plurality of memory cells, wherein each of said plurality of memory cells includes:
        a storage cell for storing one bit of data; and
        a decoder, coupled to said storage cell, for decoding write signals;
    a first set of write wires and a second set of write wires for inputting write data into said memory cells, wherein one of said two sets of write wires is coupled to a storage cell within one of said memory cells via said decoder within said respective memory cell; and
    a plurality of read wires for outputting read data from said memory cells.

2. The multiport memory according to claim 1, wherein said two sets of write wires are write wordlines.

3. The multiport memory according to claim 1, wherein said plurality of read wires are read wordlines and read bitlines.

4. The multiport memory according to claim 1, wherein said decoder is a static decoder.

5. The multiport memory according to claim 1, wherein said decoder is a dynamic decoder.

6. The multiport memory according to claim 1, wherein each wire of said first set of write wires corresponds to a write port within said multiport memory.

7. The multiport memory according to claim 1, wherein said second set of write wires has less number of wires than said first set of write wires.

* * * * *

UNITED STATES PATENT AND TRADEMARK OFFICE
CERTIFICATE OF CORRECTION

PATENT NO. : 6,144,609
DATED : November 7, 2000
INVENTOR(S) : Lattimore, et al.

It is certified that error appears in the above-identified patent and that said Letters Patent is hereby corrected as shown below:

Column 1,
Line 31, please insert a new paragraph after the word "transistors"

Column 4,
Line 19, please delete "49" and insert -- 39 --.

Signed and Sealed this

Thirteenth Day of November, 2001

Attest:

*Nicholas P. Godici*

NICHOLAS P. GODICI
*Attesting Officer*   *Acting Director of the United States Patent and Trademark Office*